US008344928B2

(12) United States Patent
Guedon et al.

(10) Patent No.: US 8,344,928 B2
(45) Date of Patent: Jan. 1, 2013

(54) METHOD AND APPARATUS FOR CAPACITANCE SENSING

(75) Inventors: Yannick Guedon, Singapore (SG); Kien Beng Tan, Singapore (SG)

(73) Assignee: STMicroelectronics Asia Pacific PTE Ltd., Singapore (SG)

( * ) Notice: Subject to any disclaimer, the term of this patent is extended or adjusted under 35 U.S.C. 154(b) by 65 days.

(21) Appl. No.: 12/943,241

(22) Filed: Nov. 10, 2010

(65) Prior Publication Data

US 2012/0112817 A1    May 10, 2012

(51) Int. Cl.
*H03M 1/12* (2006.01)

(52) U.S. Cl. ............... 341/172; 341/143; 341/155

(58) Field of Classification Search .......... 341/143, 341/155, 172
See application file for complete search history.

(56) References Cited

U.S. PATENT DOCUMENTS

| | | | |
|---|---|---|---|
| 6,040,793 A | 3/2000 | Ferguson, Jr. et al. | |
| 6,140,952 A * | 10/2000 | Gaboury | 341/143 |
| 7,288,946 B2 * | 10/2007 | Hargreaves et al. | 324/678 |
| 7,301,350 B2 * | 11/2007 | Hargreaves et al. | 324/678 |
| 7,324,029 B2 * | 1/2008 | Wang | 341/172 |
| 7,782,243 B1 * | 8/2010 | Lu | 341/172 |
| 8,054,089 B2 * | 11/2011 | Hauer et al. | 324/658 |
| 8,089,289 B1 * | 1/2012 | Kremin et al. | 324/678 |
| 2008/0111714 A1 * | 5/2008 | Kremin | 341/33 |
| 2011/0157072 A1 * | 6/2011 | Chang | 345/174 |
| 2012/0043973 A1 * | 2/2012 | Kremin | 324/658 |

FOREIGN PATENT DOCUMENTS

WO    WO2010081136    7/2010

* cited by examiner

*Primary Examiner* — Khai M Nguyen
(74) *Attorney, Agent, or Firm* — Leveque IP Law, P.C.

(57) ABSTRACT

A capacitance-to-digital converter for an extended range of capacitances includes a reference capacitor and one or more offset capacitors. Electrical charge accumulated in the offset capacitors is used to at least partially cancel the charge accumulated in a sensed capacitance to facilitate matching with a charge accumulated in the reference capacitor. The residual charge is passed to an integrator, the output from which is quantized and used to control switching of the capacitors. Immunity to tonal external noises and improved conversion speed are achieved by controlling the capacitor switching with a spread spectrum clock. The capacitance-to-digital converter may be used, for example, for sensing of the capacitances of capacitive elements in touch and proximity displays or other user interfaces.

19 Claims, 6 Drawing Sheets

METHOD AND APPARATUS FOR CAPACITANCE SENSING

BACKGROUND

The capacitance of a capacitive sensor changes when an object approaches or touches the sensor. Since the sensors require no moving parts, capacitive sensors may be robust and reliable and widely used in many areas. In particular, capacitive sensors are used in human-to-machine interfaces such as buttons, jog wheels, switches, scroll bars and touch screens.

In many applications, capacitive sensors interface to digital electronic controllers via a capacitance-to-digital converter. Sigma-delta capacitance-to-digital converters have been used successfully in many applications. In a sigma-delta converter, a sigma delta modulator generates a binary sequence of zeros and ones that indicate whether the charge accumulated by the capacitance of the sensor is greater than or less than a reference charge accumulated on a reference capacitor. The sequence of zeros and ones may be integrated and decimated to determine the relationship of the sensor's capacitance to the reference capacitance.

One limitation of this approach is that the reference capacitance must be greater than the sensor capacitance. However, if the capacitance is too large, the sensitivity of the converter is reduced. One approach to reduce this limitation is to adjust the sampling time of the reference capacitance relative to the sampling time of the sensor capacitance. Another approach is to a use an additional offset capacitor that is clocked out of phase with the excitation signal. A still further approach is to adjust the voltage of the excitation signal.

In practice, the impedance of the sensor is not purely capacitive. Hence, a further limitation is that the conversion is that the conversion speed is limited by the discharge time of the sensor capacitance. The discharge time increases as the resistive component of the sensor impedance increases. This can be a significant limitation for applications such as touch screens, which utilize a matrix of sensing elements and require multiple conversions for a single position estimate.

A further limitation is that electromagnetic interference generated by the converters is concentrated in very narrow frequency bands that are multiples of the clock frequencies.

A still further limitation is that a converter may be sensitive to noise, such as electromagnetic interference from synchronous components.

BRIEF DESCRIPTION OF THE FIGURES

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
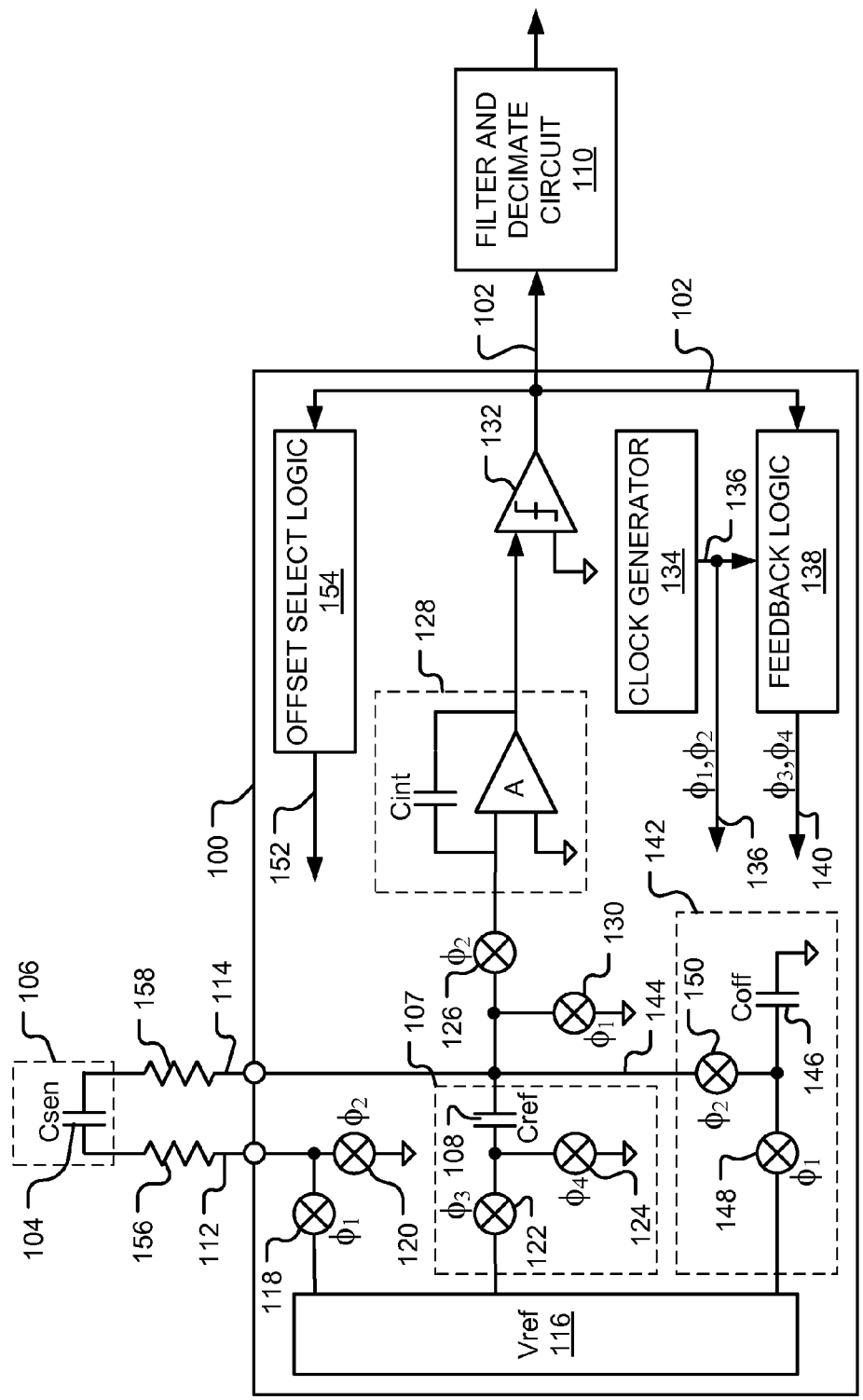
FIG. 1 is an example capacitance-to-digital converter in accordance with some embodiments of the invention.

Before describing in detail embodiments that are in accordance with the present invention, it should be observed that the embodiments reside primarily in combinations of method steps and apparatus components related to capacitance testing. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may a one or more application specific integrated circuits (ASICs), in which each function or some combinations of certain of the functions are implemented as custom logic. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such integrated circuits with minimal experimentation.

FIG. 1 is an example capacitance-to-digital converter in accordance with some embodiments of the invention. In FIG. 1, the converter 100 generates a binary sequence of zeros and ones 102 that indicate whether the charge accumulated by the capacitive element 104 of a sensor 106 is greater than or less than a reference charge generated by a reference charge generator 107. In the embodiment shown in FIG. 1, the reference charge generator 107 includes a reference capacitive element 108. The binary sequence 102 may be integrated and decimated in a filter 110, which may be integrated in the same circuit as the converter 100, to determine the relationship of the sensor's capacitive element 104 to the reference capacitive element 108. The capacitive element 104 of the sensor 106 is driven by an excitation voltage 112 that is output from the converter 100 and produces an output signal 114 that is fed back to the converter 100. In this example, the excitation voltage 112 is provided by a voltage reference source 116 that is coupled via a clocked transmission gate 118. The gate 118 is driven by a first clock signal, denoted as $\Phi_1$. During a sampling interval when the first clock signal is asserted, the gate 118 is closed and the capacitance of the sensor samples the excitation voltage. The capacitive element 104 is also coupled to ground via another clocked transmission gate 120 driven by a second clock signal, denoted as $\Phi_2$. In contrast to prior converters, the signal $\Phi_2$ is not the complement of $\Phi_1$, as will be discussed in more detail below.

The reference capacitive element 108 of the reference capacitance generator 107 is coupled to the voltage reference source 116 by a clocked transmission gate 122 and to ground via a clocked transmission gate 124. During an integration interval, the clocked transmission gate 126 is closed and the capacitances 104 and 108 are coupled to an integrator 128. In the embodiment shown, the integrator 128 comprises a capacitor 'Cint' coupled around an amplifier 'A'. When the clocked transmission gate 130 is closed the capacitive elements are coupled to ground. If gate 122 is closed during the sampling interval, the reference capacitive element 108 also samples the reference voltage, and the sum of the accumulated charges is fed to the integrator 128. If gate 122 is closed during the integration interval, charge is held in the reference capacitive element 108 and the difference of the charges is passed to the integrator. Thus, the relative timing of the transmission gates controls the charge fed into the integrator 128. The output from the integrator 128 is passed to a comparator 132 that compares the integrated value to a threshold (such as ground, for example) and generates the binary output sequence 102. A clock generator 134 generates the first and second signal clock signals 136. The clock generator may incorporate a pseudo random noise sequence (PRNS) generator, as will be discussed below with reference to FIG. 10. The binary output sequence 102 is input to feedback logic 138 where it is combined with the first and second clock signals $\Phi_1$ and $\Phi_2$ to produce the switch control signals 140 ($\Phi_3$ and $\Phi_4$) that control the clocked transmission gates of the reference capacitance generator 107. If the integrator output is high, the gates 118 and 122 are operated out of phase (e.g. $\Phi_3=\Phi_2$, $\Phi_4=\Phi_1$). If the integrator output is low, the gates 118 and 122 are operated in phase (e.g. $\Phi_3=\Phi_1$, $\Phi_4=\Phi_2$).

In general, control of the clocked transmission gates 118, 120, 126 and 130 is independent of the comparator output 102, while control of the gates 122 and 124 is dependent upon the comparator output.

In one embodiment, the dynamic range of the converted is increased by adding a charge compensation circuit 142. The charge compensation circuit 142 generates a charge 144 that at least partially compensates for the charge accumulated in the sensor capacitive element 104. In the exemplary embodiment shown in FIG. 1. An offset capacitor 146 samples a reference voltage when clocked transmission gate 148 is closed and is coupled to the integrator 128 when clocked transmission gate 150 is closed. The sampling is synchronized with the sampling of the sensor capacitive element 104.

The offset capacitor may be a selectable capacitor, the capacitance of which is controlled by a signal on control line 152. The control signal is generated from an offset select logic circuit 154. In one embodiment the capacitance of the selectable offset capacitor is selected dependent upon the binary output sequence 102. For example, the capacitance may be selected dependent upon the ratio of ones to zeros in the binary output sequence. In a further embodiment, the capacitance is programmed dependent upon characteristics of the sensor 106.

In practice, the sensor 106 is not purely capacitive, but includes a resistive component, as indicated by the series resistors 156 and 158 shown FIG. 1. The series resistance indicated by the series resistors 156 and 158 slows the rate at which the capacitive element 104 can be charged or discharged. This will be discussed below with reference to FIG. 3.

Figure 2:
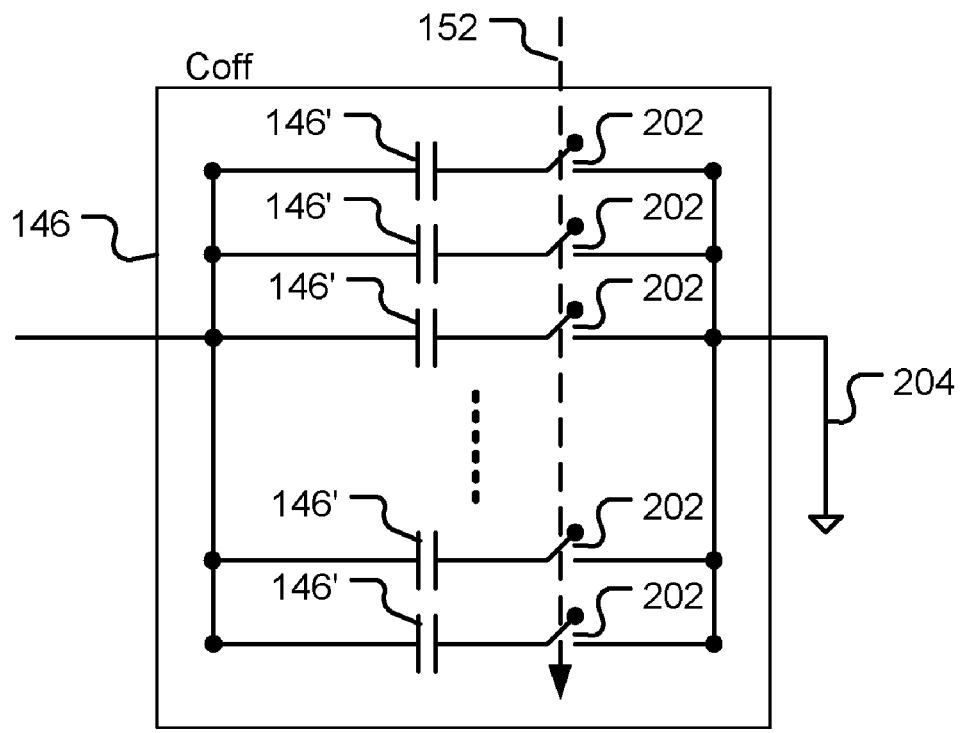
FIG. 2 is an example a switched offset capacitance in accordance with some embodiments of the invention.

FIG. 2 shows an exemplary offset capacitor 146. The capacitor 146 has a selectable capacitance and comprises a number of individual capacitive elements 146' arranged in parallel. Switches 202 are individually controlled by a control line 152 and allow the elements to be selectively couple to ground 204.

Figure 3:
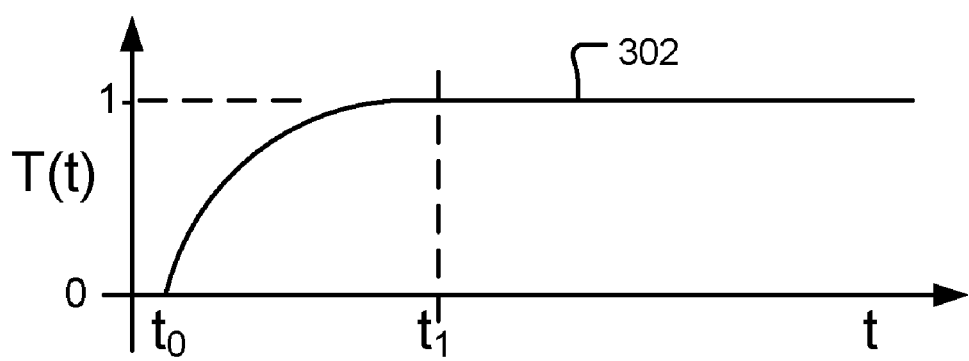
FIG. 3 is a graphical representation of an exemplary charge transfer function.

FIG. 3 is a graph showing a charge transfer function 302, denoted as T(t). The charge transfer function 302 corresponds to the proportion of the total charge in a capacitive element that transferred to or discharged from the element as a function of time, t. The charge transfer begins at time $t=t_0$ and the transfer is substantially discharged at time $t=t_1$. In general, the charge transfer is not instantaneous, since the capacitive element, or the connections to it, have a finite resistance. The higher the resistance, the lower the initial slope of the charge transfer function 302. The time constant, that is the time for the capacitor to charge to 63.2% of its full charge, is equal to the produce of the resistance and the capacitance. Generally, although never 100% charged, the capacitor is considered to be fully charged after five time constants.

Figure 4:
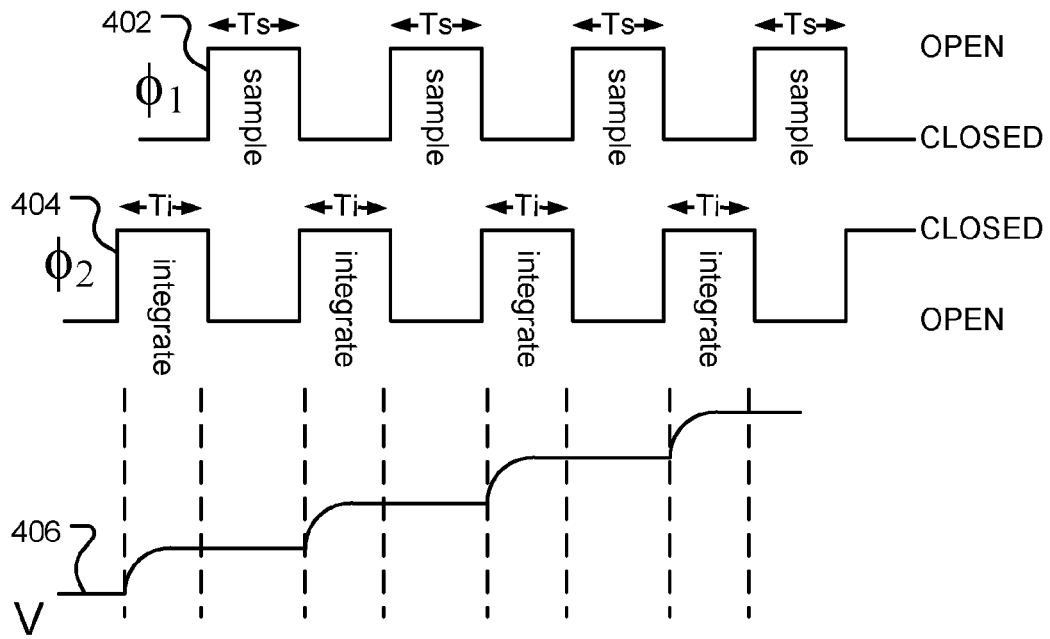
FIG. 4 is a graphical representation of clock signals and an integrator voltage in a capacitance-to-digital converter.

FIG. 4 is a graphical representation of clock signals and an integrator voltage in a capacitance-to-digital converter, plotted as a function of time. A first clock signal 402 ($\phi_1$) controls the excitation signal supplied to the capacitive element to be sensed and a second clock signal 404 ($\phi_2$) controls integration of charges. In this example, the second clock signal 404 is the complement or inversion of the first clock signal 402 and both clock signals are symmetrical. The clock signals control transmission gates, as described above. In this example, high signal level indicates that a gate is open and allows transmission (or, equivalently, that a switch is closed), while a low signal level indicates that the gate is closed. The bottom graph 406, labeled 'V', shows an example of a voltage level resulting from integration of a charge. Generally, the voltage level will increase or decrease during the integration period depending on the sign of the charge being integrated.

In prior converters, the speed of conversion is limited by the discharge time, $t_1-t_0$.

In operation, the average integrated charge over the conversion period is $$Q = C_{SENS} \times V_{REF} - C_{OFF} \times V_{REF} - R \times C_{REF} \times V_{REF} \qquad (1)$$

where $V_{REF}$ is the reference voltage, $C_{SENS}$, $C_{REF}$, $C_{OFF}$ are the sensor, reference and offset capacitances and R is difference between the number of ones and the number of zeros in the output sequence 102, divided by the total number of values in the output sequence. This expression assumes that the sampling and integration times are sufficient for the capacitive elements to be fully charged and discharged and that the same reference voltage is applied to each capacitive element.

The integrated charge is controlled, by the binary output sequence, to be zero, so the capacitance of the sensed capacitive element is given by $$C_{SENS} = C_{OFF} + R \times C_{REF} \quad (2)$$

Since the ratio R is less than or equal to one, inclusion of the offset capacitance allows sensor capacitances larger than the reference capacitance to be measured.

Figure 5:
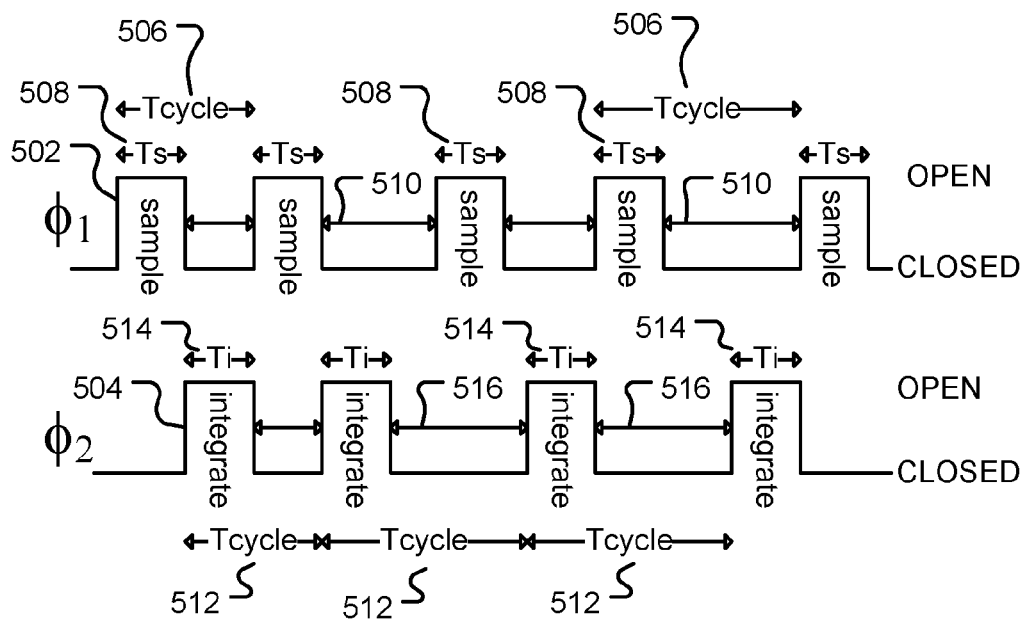
FIG. 5 is a graphical representation of clock signals in a capacitance-to-digital converter in accordance with some embodiments of the invention.

FIG. 5 is graphical representations of a first clock signal 502 and a second clock signal 504 in a capacitance-to-digital converter. In accordance with one embodiment of the invention, a first clock signal 502 has a cycle 506 (denoted as 'Tcycle' in the figure). In each cycle, the clock signal has a logic value one for a first interval 508 (denoted as Ts) and logic value zero for a second interval 510 in each cycle of the first clock signal. The first clock signal is used to generate an excitation signal that has a first voltage during the first interval 508 of the first clock signal and a second voltage value (which may correspond to an electrical ground) during the second interval 510 of the first clock. The excitation signal is supplied to the sensed capacitive element to accumulate an electrical charge on the capacitive element. The accumulated charge is dependent upon the applied voltage, so the capacitive element is said to have 'sampled' the applied voltage. In each clock cycle 512 of the second clock, the second clock signal 504 has a logic value one for a first interval 514 (denoted as 'Ti') and logic value zero for a second interval 516 in each cycle of the second clock signal. A reference electrical charge is generated dependent upon the current binary value of the binary sequence and a combination of the reference charge and the electrical charge on the capacitive element is integrated during the first interval 514 of the second clock to produce an integrated electrical charge. This integrated charge is compared to a threshold to obtain a next binary value of the binary sequence. The binary value is dependent upon whether the integrated electrical charge is above or below the threshold.

In one embodiment of the invention, the cycle 506 of the first clock signal has a non-constant duration and the cycle of the second clock signal has a non-constant duration. The varying clock rate reduces electromagnetic radiation from the converter and reduces the sensitivity of the converter to external noise. Such clock signals with varying cycle times are termed 'spread spectrum clocks', since the spectrum of the signal is spread across a range of frequencies.

In general, when the clock rate is high enough, the capacitances may not have time to fully charge or discharge during a clock cycle. We denote the proportion of maximum charge transferred to the sensed capacitive element during the sample interval as $T_1$ and denote the proportion transferred from the element during the integration interval as $T_2$. Assuming that the charge transfer functions $T_1$, $T_2$ are both constant over the conversion period, the average integrated charge is expressed as $$Q = T_2 \times T_1 \times C_{SENS} \times V_{REF} - C_{OFF} \times V_{REF} - R \times C_{REF} \times R_{REF} \quad (3)$$

Where, as before, $V_{REF}$ is the reference voltage, $C_{SENS}$, $C_{REF}$, $C_{OFF}$ are, respectively, the sensor, reference and offset capacitances, and R is ratio of ones to zeros in the output stream 102. It is assumed that the offset and reference capacitance circuits have very little resistance, so that the capacitors are fully charged and discharged in each cycle.

The integrated charge is controlled, by the binary output sequence, to be zero. Hence, the capacitance of the sensed capacitive element is $$C_{SENS} = \frac{1}{T_1 T_2} \times [C_{OFF} + R \times C_{REF}], \quad (4)$$

Since the ratio R is less than or equal to one, inclusion of the offset capacitance allows larger sensor capacitances to the measured. In addition, if the integration times are small enough, the sensitivity of the converter can be adjusted by controlling the ratio of sampling times.

In a first embodiment of the invention, the clock rate is varied but the rate is controlled to be sufficiently slow at all times that the proportions $T_1, T_2$ are substantially equal to unity. This condition satisfies the assumption that the charge transfer functions $T_1, T_2$ are constant over the conversion period. It is noted that the proportions $T_1, T_2$ depend upon the electrical properties of the sensed capacitive element and the connections to it. Thus, the minimum cycle duration may be selected dependent upon the electrical properties of the sensed capacitive element and the connections to it.

Figure 6:
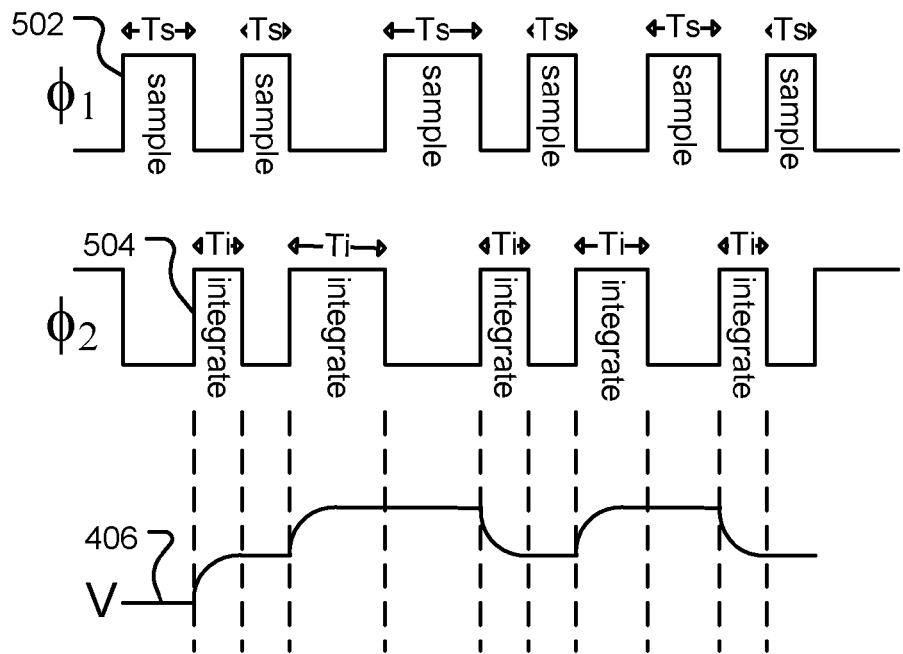
FIG. 6 and FIG. 7 are graphical representations of clock signals and integrator voltages in a capacitance-to-digital converter in accordance with some embodiments of the invention.

FIG. 6 is a graphical representation of a first clock signal 502, a second clock signal 504 and an integrator voltage 406 in a capacitance-to-digital converter in accordance with some embodiments of the invention. In FIG. 6, the first clock signal 502 and the second clock signal 504 have variable duration clock cycles. However, the minimum sample interval Ts and the minimum integration interval Ti are long enough that the sensed capacitive element has time to substantially charge and discharge in each cycle. As a result, the change in the integrator voltage 406 depends only on the comparator output signal, and is independent of the clock cycle period.

In a further embodiment of the invention, the clock rate is varied (i.e. a spread spectrum clock is used), but the integration and sampling times are kept constant over the conversion time. The clock is therefore asymmetric. Again, this satisfies the assumption that the charge transfer functions $T_1$, $T_2$ are constant over the conversion period.

The charge transfer functions, $T_1$ and $T_2$, are functions of time and depend upon the electrical characteristics of the sensor. If these characteristics are known (for example from calibration measurements) an absolute value of the sensed capacitance may be obtained. Otherwise, since the scaling factor $$\frac{1}{T_1 T_2}$$

is constant, the expression may be used to compare a number of capacitive elements with similar charge transfer characteristics—such as the elements of a capacitive touch screen.

Figure 7:
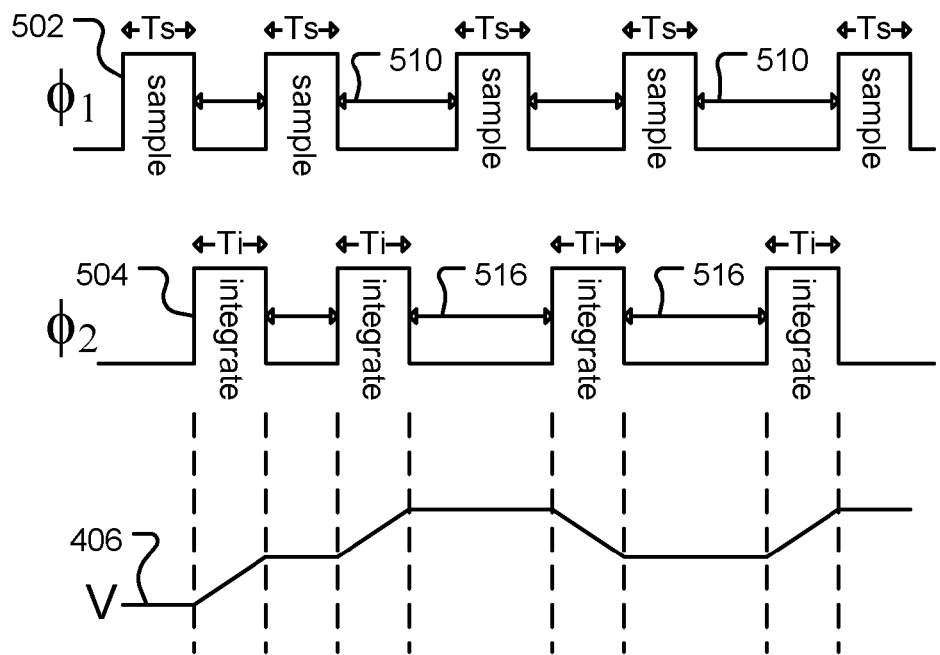

FIG. 7 is a graphical representation of a first clock signal 502, a second clock signal 504 and an integrator voltage 406 in a capacitance-to-digital converter in accordance with some embodiments of the invention. In FIG. 7, the first clock signal 502 and the second clock signal 504 have variable duration clock cycles. However, the sample interval Ts and the integration interval Ti are constant from one cycle to the next during a conversion. As a result, the change in the integrator voltage 406 depends only on the comparator output signal, and is independent of the clock cycle period, even though the sensed capacitive element may not have time to fully charge and discharge (in the figure, the integrated voltage level is still rising or falling at the end of each integration period).

Figure 8:
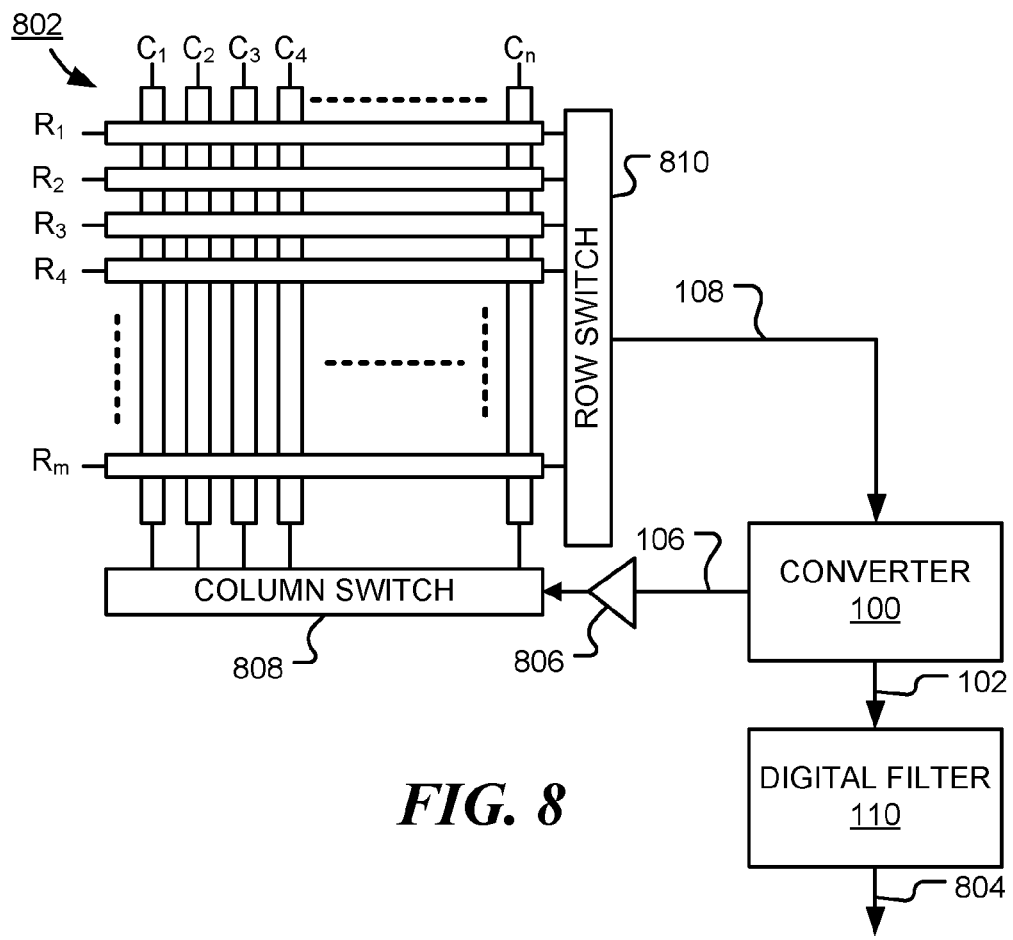
FIG. 8 is a simplified block diagram of a touch and proximity sensor in accordance with some embodiments of the invention.

FIG. 8 is a simplified block diagram of a touch and proximity sensor in accordance with some embodiments of the invention. The sensor comprises a number of row elements, $R_1, R_2, R_3, \ldots, R_m$, and a number of column elements $C_1, C_2, C_3, \ldots, C_n$, arranged to form a grid. The elements may be positioned in a touch screen of a portable electronic device, for example. A capacitance-to-digital converter 100 converters a capacitance of the sensor to a binary sequence 102 that may be filtered and decimated in digital filter 110 to provide a multi-bit, digital representation 804 of the capacitance. The digital representation 804 may be input to a processor to provide a man-machine interface, for example. The converter 100 supplies an excitation signal 106 that is amplified in amplifier 806 and fed to column switch 808. The column switch is controlled to select the column element to which the excitation is applied. Similarly, a row switch 810 is controlled to select the row element that is to be sensed. The sensed signal 108 is passed back to the converter 100. In operation, each row-column pair is selected in turn.

Figure 9:
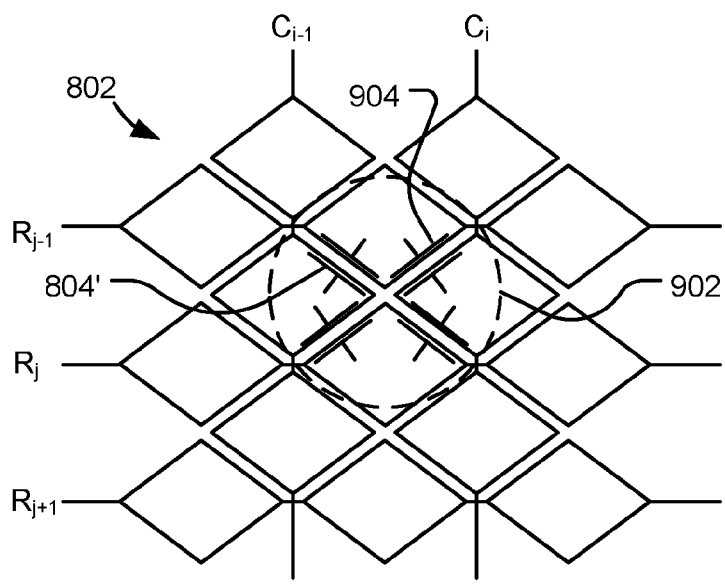
FIG. 9 is further block diagram of a touch and proximity sensor in accordance with some embodiments of the invention.

FIG. 9 is further block diagram of a touch and proximity sensor in accordance with some embodiments of the invention. FIG. 9 shows a more detailed view of a section of touch and proximity sensor. In this example, each row and each column comprise a connected line of diamond shaped conductors. The matrix of sensing elements is sometimes referred to as a Transparent Diamond Matrix and may be stacked on top of or integrated with a display of an electronic device. When a capacitive object, such as a finger, stylus, pen etc. is touching the sensor or is moved into the proximity of the sensor in a region 902, the capacitance 904 between row and column elements in the region is increased. In the example shown, the capacitance is increased for the four element pairs $(C_{i-1}, R_{j-1})$, $(C_i, R_{j-1})$, $(C_{i-1}, R_j)$ and $(C_i, R_j)$. If the capacitive object is moved away slightly, more elements pairs will be affected, but the change in capacitance for each pair will be reduced. Thus, for sensing both touch and proximity, the converter 100 should be able to measure a wide range of capacitances. The use of an offset capacitance is one way of achieving this. Additionally, since the capacitance changes may be small, the converter should be insensitive to noise. Use of a variable speed clock reduces the converter's sensitivity to noise. Still further, for a sensor with a high spatial resolution, many element pair must be sensed for each position measurement, so it is advantageous for the converter sensor to have a short conversion time.

Figure 10:
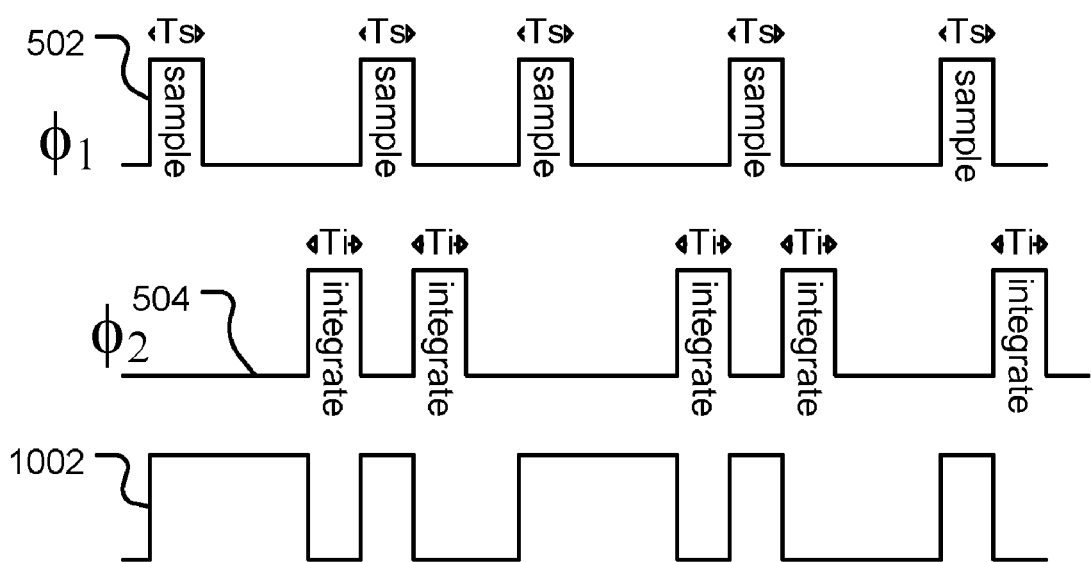
FIG. 10 is a graphical representation of clock signals generated by a random or pseudo-random sequence in a capacitance-to-digital converter, in accordance with some embodiments of the invention Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

In one embodiment, the first and second clock signals are generated from a pseudo-random binary sequence or random binary sequence. An example is shown in FIG. 10. A random or pseudo-random sequence 1002 is generated. Circuits for generating pseudo-ransom sequences are well known to those of ordinary skill in the art. At each rising edge of the pseudo-random sequence 1002, a fixed duration pulse is generated in a first clock signal 502. At each falling edge of the pseudo-random sequence 1002, a fixed duration pulse is generated in a second clock signal 504. In this manner, two interleaved, but uncorrelated, clock signals are obtained. These may be used as $\Phi_1$ and $\Phi_2$ (or $\Phi_2$ and $\Phi_1$). Other methods for generating the spread spectrum clock signals $\Phi_1$ and $\Phi_2$ will be apparent to those of ordinary skill in the art.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for converting a capacitance of a sensed capacitive element to a binary sequence, the method comprising, for each binary value of the binary sequence:
    generating a first clock signal that has a logic value one for a first interval and logic value zero for a second interval in each cycle of the first clock signal;
    generating an excitation signal that has a first voltage during the first interval of the first clock signal and a second voltage value during the second interval of the first clock;
    supplying the excitation signal to the sensed capacitive element to accumulate an electrical charge on the capacitive element;
    generating a second clock signal that has a logic value one for a first interval and logic value zero for a second interval in each cycle of the second clock signal;
    generating a reference electrical charge dependent upon the current binary value of the binary sequence;
    integrating a combination of the reference charge and the electrical charge on the capacitive element during the first interval of the second clock to produce an integrated electrical charge; and
    comparing the integrated electrical charge to a threshold to obtain a next binary value of the binary sequence, the next binary value being dependent upon whether the integrated electrical charge is above or below the threshold,
    wherein the cycle of the first clock signal has a non-constant duration, and wherein the cycle of the second clock signal has a non-constant duration.

2. A method in accordance with claim 1, wherein the first interval of the first clock signal has a constant duration.

3. A method in accordance with claim 1, wherein the first interval of the second clock signal has a constant duration.

4. A method in accordance with claim 3, wherein the first interval of the second clock is shorter than the time for the sensed capacitive element to completely discharge.

5. A method in accordance with claim 1, wherein the first interval of the second clock signal occurs within the second interval of the first clock signal.

6. A method in accordance with claim 1, wherein generating the excitation signal comprises passing a reference voltage through a first clocked transmission gate clocked by the first clock signal.

7. A method in accordance with claim 1, wherein generating a reference electrical charge comprises:
    passing a reference voltage through a second clocked transmission gate to a reference capacitive element, the second clocked transmission gate being clocked by a clock signal selected from the first and second clock signals,
    wherein the selection of the clock signal supplied to the second clocked transmission gate is dependent upon the current binary value of the binary sequence.

8. A method in accordance with claim 1, further comprising generating an offset electrical charge by passing a reference voltage through a third clocked transmission gate to a first plate of an offset capacitive element.

9. A method in accordance with claim 8, wherein the offset capacitive element has a selectable capacitance.

10. A method in accordance with claim 8, wherein the third clocked transmission gate is clocked by the first clock signal and wherein the offset electrical charge is accumulated on the first plate of the offset capacitive element.

11. A capacitance-to-digital converter for converting the capacitance of a sensed capacitive element to a sequence of binary values, the capacitance-to-digital converter comprising:
a clock generator operable to generate a first clock signal having logic value one for a first interval and logic value zero for a second interval in each cycle of the first clock signal and a second clock signal having logic value one for a first interval and logic value zero for a second interval in each cycle of the second clock signal, the first interval of the first clock and the first interval of the second clock being non-overlapping in time;
a first output operable to supply an excitation signal to the sensed capacitive element, the excitation signal having has a first voltage during the first interval of the first clock signal and a second voltage value during the second interval of the first clock;
a first input operable to receive an input signal produced by the sensed capacitive element in response to the excitation signal;
a reference charge generator operable to produce a reference electrical charge dependent upon the first and second clock signals and dependent upon a current binary value of the sequence of binary values;
an integrator that produces an integrated signal in response to the first input signal and the reference electrical charge; and
a comparator that produces a binary value of the sequence of binary values in response to the integrated signal, the binary value being dependent upon whether the integrated signal exceeds a threshold,
wherein the cycle of the first clock signal has a non-constant duration.

12. A capacitance-to-digital converter in accordance with claim 11, wherein, during a conversion, the first interval of the first clock signal has a constant duration and wherein first interval of the second clock signal has a constant duration.

13. A capacitance-to-digital converter in accordance with claim 12, wherein the clock generator comprises:
a random number generator operable to produce a spread spectrum clock signal;
a first clock circuit that generates a logic one for a fixed period when a rising edge of the spread spectrum clock signal detected; and
a second clock circuit that generates a logic one for a fixed period when a falling edge of the spread spectrum clock signal is detected.

14. A capacitance-to-digital converter in accordance with claim 11, wherein the reference charge generator comprises:
a clocked transmission gate clocked by a clock signal selected from the first and second clock signals;
a reference capacitive element; and
a voltage source coupled to a first plate of the reference capacitive element through the clocked transmission gate.

15. A capacitance-to-digital converter in accordance with claim 11, further comprising an offset charge generator operable to produce an offset electrical charge dependent upon the first and second clock signals, wherein the integrator produces an integrated signal in response to the first input signal, the reference electrical charge and the offset electrical charge.

16. A capacitance-to-digital converter in accordance with claim 15, wherein the offset charge generator comprises:
a clocked transmission gate clocked by the first clock signal; an offset capacitive element; and
a voltage source coupled to a first plate of the offset capacitive element through the clocked transmission gate,
wherein the offset electrical charge is accumulated on the first plate of the offset capacitive element.

17. A capacitance-to-digital converter in accordance with claim 15, wherein the capacitance of the offset capacitive element is selectable.

18. A capacitance-to-digital converter in accordance with claim 15, wherein the offset charge generator comprises:
a clocked transmission gate clocked by the second clock signal; an offset capacitive element; and
a voltage source coupled to a first plate of the offset capacitive element through the clocked transmission gate,
wherein the offset electrical charge is accumulated on a second plate of the offset capacitive element.

19. A capacitive touch and proximity sensor comprising:
a plurality of conductive column elements;
a plurality of conductive row elements, each located at an angle to and passing in close proximity to the plurality of conductive column elements;
a capacitance-to-digital converter, operable to modulate a reference voltage with a first spread spectrum clock to produce an excitation signal;
a column switch, operable to couple the excitation signal to a selected column element of the plurality of column elements; and
a row switch, operable to selectively couple a row element of the plurality of row elements to an input of the capacitance-to-digital converter,
a reference charge generator operable to produce a reference electrical charge dependent upon the first spread spectrum clock signal, a second spread spectrum clock signal and a digital value of the sequence of digital values;
an offset charge generator operable to produce an offset electrical charge dependent upon the first and second spread spread spectrum clock signals;
a clocked transmission gate, controlled by the second spread spectrum clock signal, configured to receive the input of the capacitance-to-digital converter, the reference electrical charge and the offset electrical charge and to transmit a combined charge when the clocked transmission gate is open; and
an integrator that receives the combined charge as input and produces an integrated signal; and
a comparator that produces a digital value of the sequence of digital values in response to the integrated signal, the digital value being dependent upon whether the integrated signal exceeds a threshold.
wherein the capacitance-to-digital converter is further operable to produce a sequence of digital values dependent upon a capacitance formed between the selected row element and the selected column element by an object in proximity the selected row element and the selected column element.

* * * * *